Figure 1:
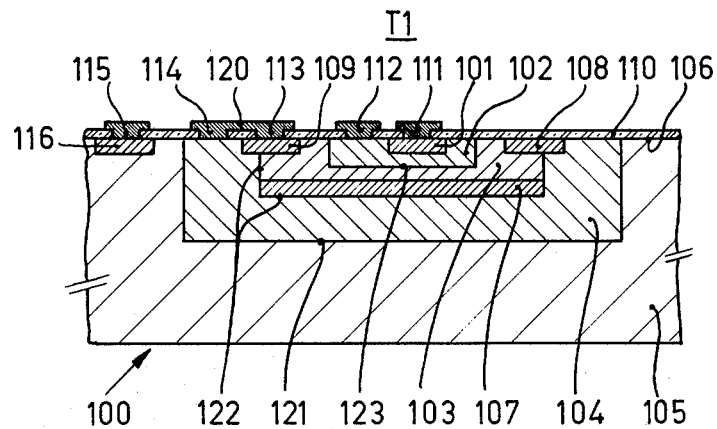

United States Patent [19]

Aagaard

[11] 3,999,215
[45] Dec. 21, 1976

[54] INTEGRATED SEMICONDUCTOR DEVICE COMPRISING MULTI-LAYER CIRCUIT ELEMENT AND SHORT-CIRCUIT MEANS

[75] Inventor: Einar Andreas Aagaard, Eindhoven, Netherlands

[73] Assignee: U.S. Philips Corporation, New York, N.Y.

[22] Filed: Mar. 21, 1975

[21] Appl. No.: 560,643

Related U.S. Application Data

[63] Continuation of Ser. No. 354,516, April 26, 1973, abandoned.

[30] Foreign Application Priority Data

May 31, 1972 Netherlands ............... 7207325

[52] U.S. Cl. ............... 357/48; 357/40; 357/47; 357/52; 357/86
[51] Int. Cl.² ............... H01L 27/04; H01L 27/02; H01L 29/34
[58] Field of Search ............... 357/46, 47, 48, 50, 357/52, 86

[56] References Cited

UNITED STATES PATENTS

| | | | |
|---|---|---|---|
| 3,283,170 | 11/1966 | Buie | 357/48 |
| 3,474,308 | 10/1969 | Kronlage | 357/48 |
| 3,502,951 | 3/1970 | Hunts | 357/48 |
| 3,517,280 | 6/1970 | Rosier | 357/48 |
| 3,590,345 | 6/1971 | Brewer et al. | 357/48 |
| 3,596,149 | 7/1971 | Makimoto | 357/48 |
| 3,648,130 | 3/1972 | Castrucci et al. | 357/48 |

*Primary Examiner*—Edward J. Wojciechowicz
*Attorney, Agent, or Firm*—Frank R. Trifari; Leon Nigohosian

[57] ABSTRACT

An integrated circuit having multi-layer transistors which are separated from each other by means of tub-shaped or dish-shaped isolation zones. The isolation zones are of a conductivity type opposite to that of the zone of the circuit element which adjoins the inner wall of the tub-shaped zone and is present within the isolation zone, the p-n junction between the last-mentioned zone and the isolation zone being substantially short-circuited. As a result of this it is substantially prevented that the adjoining zone of the circuit element injects, via said p-n junction, charge carriers into the isolation zone, as a result of which the isolation is improved inter alia in that sense that the leakage current is reduced and higher breakdown voltages and smaller stray capacitances occur.

9 Claims, 4 Drawing Figures

INTEGRATED SEMICONDUCTOR DEVICE COMPRISING MULTI-LAYER CIRCUIT ELEMENT AND SHORT-CIRCUIT MEANS

This is a continuation of application Ser. No. 354,516, filed Apr. 26, 1973, now abandoned.

The invention relates to an integrated semiconductor device having a semiconductor body in which at least a multi-layer semiconductor circuit element adjoining a surface of the semiconductor body is provided and is insulated from the remainder of the semiconductor body by a tub-shaped isolation zone which entirely surrounds the circuit element in the semiconductor body and is of a conductivity type which is opposite to that of the zone of the circuit element adjoining the inner wall of the tub-shaped insulation zone and to that of the part of the semiconductor body surrounding the tub-shaped isolation zone.

A usual method of providing in an integrated semiconductor device circuit elements which are insulated from each other consists in providing a semiconductor body of one conductivity type with islands of the opposite conductivity type which adjoin a surface of the semiconductor body and providing the circuit elements in said islands. The part of one conductivity type of the semiconductor body surrounding the islands may be considered as an isolation region.

During operation of the structures of the type obtained in this manner, majority charge carriers can penetrate into the part of the semiconductor body surrounding the islands and give rise to leakage currents. In addition, said form of isolation often involves a large stray capacitance and a low breakdown voltage. Surrounding each of the circuit elements by tub-shaped isolation zones of a conductivity type opposite to both that of the adjacent layer or layers of the surrounded circuit elements and to that of the surrounding part of the semiconductor body in such manner that the isolation zones adjoin the surface of the semiconductor body and further, within the volume of the semiconductor body, surround the circuit elements entirely, removes said drawbacks only partially.

It is the object of the invention to provide a structure in which, with simple means, the said leakage currents are suppressed entirely or substantially entirely and the breakdown voltage is considerably increased, while the stray capacitance has a low value.

The said known measures to isolate the circuit elements have as a common characteristic feature that the isolation regions are set up at a potential which is not directly related to that of the adjoining layer of a circuit element. At first sight this also seems most obvious and even desirable to electrically isolate the said layer, also in the case of fluctuating potentials, from adjacent structures. It has surprisingly been found, however, that if means are provided which ensure that the potential of said isolation region is related to that of the adjoining layer of the bipolar structure in such manner that the p-n junction present between the isolation region and the said layer cannot or at least substantially not become polarized in the forward direction within the operating range of currents and voltages of the semiconductor circuit elements, the leakage currents are substantially reduced to zero and the breakdown voltage is considerably increased, while the isolation region only involves a small stray capacitance. This unexpected, favourable effect can be understood for tub-shaped isolation zones on the basis of the recognition that the isolation region may be considered as the base of a three-layer transistor of which the adjoining layer of the circuit elements and the surrounding part of the semiconductor body may be considered as the emitter and collector, respectively. The current of such a transistor to the surrounding part of the semiconductor body is minimum and the breakdown voltage is large if the base is given a potential which is related to the emitter in such manner that the latter can inject no or substantially no minority charge carriers into the base.

An integrated semiconductor device of the type mentioned in the preamble is therefore characterized according to the invention in that the p-n junction formed between the tub-shaped isolation zone and the zone of the circuit element adjoining the inner wall of the tub-shaped isolation zone is substantially short-circuited.

Figure 2:
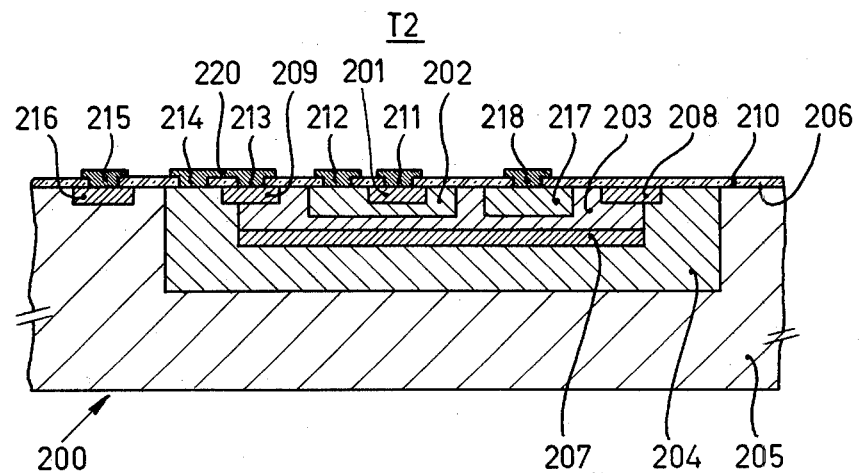
Figure 3:
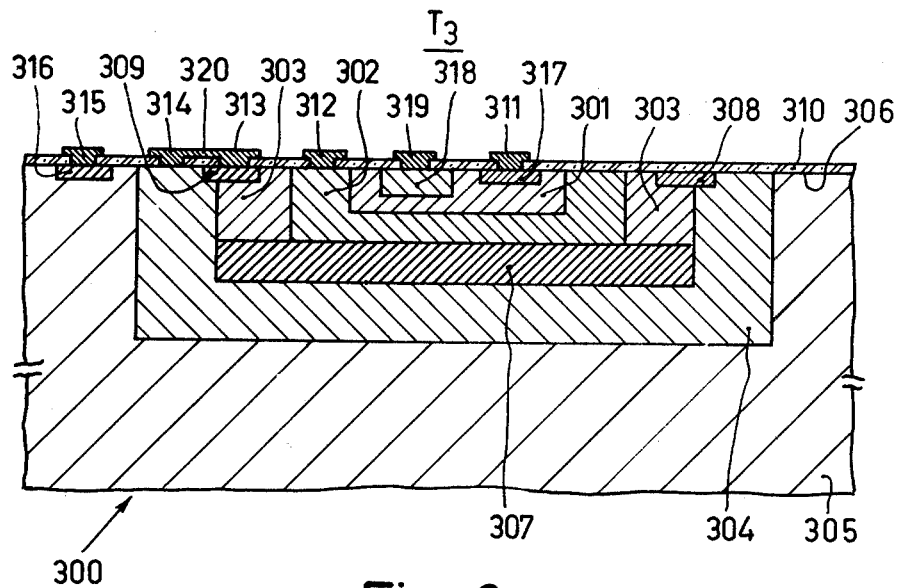

The invention will be described in greater detail with reference to the diagrammatic drawing, in which FIG. 1 is a cross-sectional view of a part of a first embodiment of an integrated semiconductor device according to the invention comprising a bipolar transistor and a tub-shaped isolation zone surrounding said transistor, further semiconductor circuit elements (not shown) being present elsewhere in the semiconductor body, FIGS. 2 and 3 are cross-sectional views of parts of other embodiments in which more complex bipolar semiconductor circuit elements are integrated instead of a simple bipolar transistor.

Figure 4:
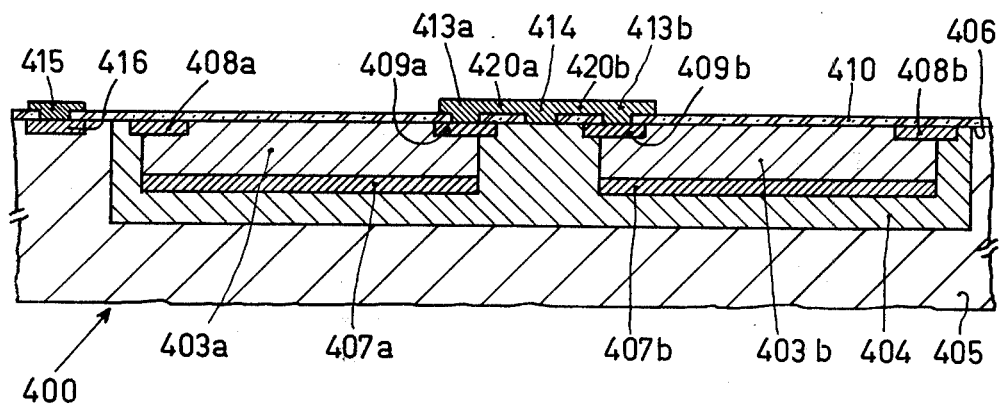

FIG. 4 is a cross-sectional view of a part of an embodiment in which two tub-shaped isolation zones which may each comprise one or more bipolar semiconductor circuit elements have a common wall portion.

The semiconductor device shown in FIG. 1 consists of a semiconductor body 100 comprising an emitter zone 101, a base zone 102, a collector zone 103, a tub-shaped isolation zone 104 and a part 105 or substrate region 105 surrounding the tub-shaped isolation zone and consisting of the remaining part of the semiconductor body. The emitter zone 101, the collector zone 103 and the substrate region 105 are of one conductivity type, in the present embodiment n-type, while the base zone 102 and the isolation zone 104 are of the opposite conductivity type, so in the present example p-type.

The emitter zone 101 is surrounded by the base zone 102 which in turn is surrounded by the collector zone 103 which in turn is surrounded by the isolation zone 104, while the substrate region 105 surrounds the isolation zone 104. The zones or regions 101, 102, 103, 104 and 105 adjoin the surface 106 of the semiconductor body 100. The zones 101, 102, 103 with the contacts 111, 112 and 113 constitute a bipolar transistor $T_1$.

In addition the collector zone 103 comprises a buried zone 107 and a few regions 108 and 109 adjoining the surface.

The buried zone 107 and the regions 108 and 109 are of the same conductivity type as the remainder of the collector zone but have a lower resistivity than said remainder. In the embodiment of FIG. 1 the buried zone 107 and the regions 108 and 109 partly adjoin the isolation zone 104. In variations of this embodiment, the zone 107 and the region 108 or 109 may be present in the collector zone 103 while spatially separated from the zone 104. The said regions 108 and 109 may also be united to one and the same region, for example, to form a ring which surrounds the base zone 103. The regions 108 and 109 may also extend from the surface 106 down to the buried zone 107. Finally, the substrate region 105 comprises a region 116 of the same conductivity type as the substrate region but having a lower resistivity which adjoins the surface 106 of the semiconductor body.

Except for a few apertures, the surface 106 is covered with an insulating layer 110 through which apertures metal contacts are provided on the semiconductor body. An emitter contact 111, a base contact 112, a collector contact 113, an isolation zone contact 114 and a substrate contact 115 make "ohmic" connections with the zones 101 and 102, the region 109 of the zone 103, the zone 104 and the region 116 of the substrate region 105, respectively. Such semiconductor structures are known per se and can be manufactured with known technologies.

According to the invention, the isolation zone 104 is electrically connected, via the metallisation 120, to the collector zone 103, that is to say by a short-circuit between the contacts 113 and 114.

The semiconductor device shown in FIG. 2 is in principle equal to that shown in FIG. 1, with the exception of an extra zone 217 with its contact 218, in which the semiconductor body 200, the zones 201, 202, 203 and 204, the region 205, the surface 206, the regions 207, 208, 209 and 216, the insulating layer 210, the contacts 211, 212, 213, 214 and 215, and the short-circuit 220 in FIG. 2 correspond to the semiconductor body 100, the zones 101, 102, 103 and 104, the region 105, the surface 106, the regions 107, 108, 109 and 116, the insulating layer 110, the contacts 111, 112, 113, 114, 115 and the short-circuit 120, respectively, of FIG. 1.

The extra zone 217 adjoins the surface 206, has a contact 218 there, is surrounded by the collector zone 203 as is the base zone 202 and is of the same conductivity type as the base zone 202. Together with the zone 202 and the surrounding zone 203, the extra zone constitutes a lateral transistor which is of the complementary conductivity type with respect to the vertical transistor present having the zones 201, 202 and 203. The extra zone 217 of said lateral transistor may be considered as an emitter, the zone 203 as a base and the zone 202 as a collector. As a whole, the zones 201, 202, 203 and 217 with their contacts constitute a lateral four-layer transistor $T_2$.

The semiconductor device shown in FIG. 3 is in principle quite the same as the semiconductor device shown in FIG. 1 with the exception of the extra region 317 and the extra zone 318 with a contact 319.

The semiconductor 300, the zones 301, 302, 303 and 304, the region 305, the surface 306, the regions 307, 308, 309 and 316, the insulating layer 310 and the contacts 311, 312, 313, 314, 315 and the short-circuit 320 shown in FIG. 3 correspond to the semiconductor body 100, the zones 101, 102, 103 and 104, the region 105, the surface 106, the regions 107, 108, 109 and 116, the insulating layer 110, the contacts 111, 112, 113, 114 and 115 and the short circuit 120, respectively, shown in FIG. 1.

In deviation from the semiconductor device shown in FIG. 1, the semiconductor device shown in FIG. 3 is made so that the zone 301 has a comparatively high resistivity. Said zone comprises the extra region 317 which adjoins the surface 306 and is of the same conductivity type as the zone 301 but has a lower resistivity. The contact 311 is electrically connected to the zone 301 via the extra region 317.

The zone 301 comprises moreover an extra zone 318 of the opposite conductivity type adjoining the surface 306. Said extra zone comprises a contact 319 at the surface 306.

The zones 318, 301 and 303 of alternate conductivity type constitute with their contacts a vertical four-layer transistor $T_3$.

When short-circuiting the zones 302 and 303 via their contacts 312 and 313, the zones 318, 301 and 302 operate as a normal vertical transistor which is of the complementary conductivity type with respect to the transistor $T_1$ shown in FIG. 1.

It is also possible to make said transistor shown in FIG. 3 which is complementary to $T_1$ into a four-layer transistor by providing an extra zone of the first conductivity type simultaneously with the regions 308, 309, 316 and 317 at the surface but now in such manner inside the region of zone 318 that said extra zone is comprised by the remaining part of the zone 318.

The semiconductor device shown in FIG. 4 relates to a variation having two combined tub-shaped isolation zones. Said device comprises a semiconductor body 400 having two isolated island regions, 403a and 403b, respectively, a combined tub-shaped isolation zone 404 and a substrate region 405. The island regions 403a and 403b and the substrate region 405 are of the one conductivity type, in the present example n-type, while the isolation zone 404 is of the opposite conductivity type, so in the present example p-type.

The island regions 403a and 403b are each separately surrounded by the isolation zone 404. All the said zones or regions adjoin the surface 406 of the semiconductor body 400. Moreover, the island regions comprise a buried zone 407a and 407b, respectively, and a few regions 408a and 409a and 408b and 409b, respectively, adjoining the surface. The regions 407a, 407b, 408a, 408b, 409a and 409b are of the same conductivity type as the remaining parts of the island-shaped regions but they have a lower resistivity than said remaining parts. Finally, the substrate region 405 comprises a region 416 of the same conductivity type as the substrate region but having a lower resistivity which adjoins the surface 406 of the semiconductor body.

Except for a few apertures, the surface 406 is covered with an insulating layer 410. Via the apertures, contacts are provided on the semiconductor body. Island contacts 413a and 413b, the isolation zone contact 414 and the substrate contact 415 make "ohmic" connections with the island regions 403a and 403b, respectively, via the regions 409a and 409b, respectively, to the isolation zone 404 and the substrate region 405 via the region 416.

In accordance with the invention, the isolation zone 404 is electrically connected to the island regions 403a and 403b, via the metallisations 420a and 420b, respectively. Complete embodiments are obtained, starting from FIG. 4, by providing the island regions with semiconductor circuit elements in a manner conventionally used in semiconductor technology.

So according to the invention, an arbitrary bipolar multi-layer transistor structure incorporated in a semiconductor body is isolated in a simple manner from the substrate region of the semiconductor body surrounding said structure, by using an isolation zone between the said structure and the substrate region, namely in such manner that the leakage current between the structure and the substrate region is extremely small and substantially independent of the currents in the transistor structure, at least for currents within the operating range thereof, while furthermore the isolation has a high breakdown voltage and a small capacity.

The operation of the invention and the advantages thereof will be described in detail with reference to the embodiment shown in FIG. 1.

During operation, such a potential is set up at the substrate region 105 that the p-n junction 121 between the isolation zone 104 and the substrate 105 remains in the reverse direction and passes no current with the exception of a very small leakage current.

Due to the short circuit 120 of the p-n junction 122 constituted by the tub-shaped isolation zone 104 and the zone 103 of the semiconductor structure adjoining the inner wall of the tub-shaped zone 104, which inner wall is constituted by the p-n junction 122, emission by the last mentioned p-n junction is excluded as a result of which no minority charge carriers can be injected from the zone 103 into the isolation zone 104. Without said short circuit or another electric by-pass of said p-n junction 122, minority charge carriers, if any, injected via said p-n junctions 122 into the isolation zone 104 will partly diffuse through down to the insulating p-n junction 121 and be collected by the substrate region 105 as majority charge carriers as a result of which the isolation leakage current increases.

So the shortcircuit 120 has for its effect that no larger leakage current can flow between the isolation zone 104 and the substrate region 105 than that leakage current which is inherent in the intermediately located reverse p-n junction 121.

The presence of minority charge carriers of the opposite type in the zone 103 gives rise to leakage current-increasing injections of minority charge carriers in the isolation zone 104.

In the present example shown in FIG. 1, the last-mentioned minority charge carriers are supplied to the collector zone 103 by emission from the base zone 102 via the p-n junction 123 between the base zone 102 and the collector zone 103 which is in the forward condition. This occurs upon saturation or upon inverse use of the transistor $T_1$ consisting of the emitter zone 101, the base zone 102 and the collector zone 103.

A part of the minority charge carriers injected in the collector zone 103 is collected by the isolation zone 104 as majority charge carriers as a result of which, if no counter-measures are taken, same is charged so that the p-n junction 122 comes in the forward condition, as a result of which the leakage-causing emission takes place.

Said leakage current itself again contributes to the said emission, as a result of which a leakage intensifying effect is formed.

According to the invention, in the example shown in FIG. 1, a p-n junction 122 between the isolation zone 104 and the collector zone 103 is short-circuited near the surface 106 via the metallisation 120. As a result of this, the current in the isolation zone 104 as a result of collection of charge carriers from the collector zone 103 is returned via the short-circuit 120 to the same collector zone 103, namely to those places of said zone from which the isolation zone 104 collects charge carriers. Said divided current on its way in the isolation zone and in the collector zone experiences a resistance corresponding to the current distribution, as a result of which the p-n junction 122 between the isolation zone 104 and the collector zone 103 at some distance from the short circuit 120 nevertheless is biased slightly in the forward direction. However, as long as said effect is restricted to below a few tenths of a volt, it has substantially no effect on the leakage current.

Of course, as a result of said resistance effect the region of transistor currents for which the shortcircuit operates effectively at the surface is restricted. This current region can be increased by providing a readily conducting isolation zone 104 and the readily conducting buried zone 107 and the region 109 which is likewise readily conducting.

Moreover a low resistivity of the regions 107, 108 and 109 has the favourable effect that the recombination rate of minority charge carriers in the collector zone 103 near the isolation zone 104 is increased so that the collection by the zone 104 and the current in said zone based on the said collection is reduced. Said measures within the zone 103 which increase the transistor current region are found to have no adverse influence on the breakdown voltage and the junction capacity of the isolation due to the said shortcircuit according to the invention.

Since now there is freedom in choosing a high resistivity for the substrate region 105 both a high breakdown voltage and a low junction capacity of the isolation are obtained without further measures.

However, due to the said measures within the zones 103, the intensification of the "isolation transistor" with the zone 103 as the emitter, the zone 104 as the base and the region 105 as the collector is increased by improving the emitter efficiency. Without the shortcircuit according to the invention, said transistor action results in an intensification of the capacitive currents and a multiplication effect, as a result of which the isolation capacity is increased and the isolation breakdown voltage is reduced.

Said capacity increase and decrease of the breakdown voltage is excluded by means of the short-circuit of the emitter-base junction of the "isolation transistor". The measures within the zone 103 then are even to advantage by improving the last-mentioned short-circuit.

In the other embodiments shown in FIGS. 2, 3 and 4, the substrate region is also set up at such a potential during operation that the p-n junction between the isolation zone and the substrate region remains in the reverse condition and the isolation measures according to the invention have the same effect and properties as in the embodiment shown in FIG. 1.

With respect to the embodiment shown in FIG. 2 it may be noted that when the four-layer transistor occurring therein is conventionally used as a switch, substantially the whole switch current flows via the extra zone 217 and that in such manner that the p-n junction between the zone 217 and the zone 203 conveys said current in the forward direction.

With respect to the said current, the zone 203 in this case obtains a rather considerable supply of minority charge carriers. In this case, a large and strong current-dependent isolation leak would be formed without the short-circuit 220 between the contacts 213 and 214 of the zones 203 and 204.

In general it applies that several semiconductor circuit elements which are integrated in a common substrate region can operate quite independently of each other, provided they are each separately isolated according to the invention and the various isolation zones are entirely surrounded within the semiconductor body by the substrate region. At the areas where the zones of the semiconductor circuit element adjoining the isolation zones are electrically connected together, however, the walls of the isolation zones may have a common part as is shown, for example, in FIG. 4. This provides space saving without the possibility of any stray influence because the transport of charge carriers through the common wall is excluded due to the short-circuits according to the invention.

A semiconductor device according to the invention can be manufactured entirely by means of methods conventionally used in semiconductor technology.

It will be obvious that the invention may also be advantageously applied to isolation of bipolar structures of a more complicated nature than those described above. Within an isolation tub, other circuit elements, such as diodes, resistors, capacitors and field effect transistors, may be present in addition to the above-mentioned bipolar layer transistors.

In addition to the most frequently used silicon, the material for the semiconductor body may also be any other semiconductor material, such as a AIII-BV compound, which is suitable for manufacturing bipolar integrated circuits. The short-circuits 120, 220, 320, 420a and 420b may also be present entirely on the semiconductor surface 106, 206, 306 and 406, respectively. The short-circuiting connection by-passing the p-n junction may also comprise a diode having a low threshold voltage, for example, a metal-to-semiconductor diode of the Schottky type.

What is claimed is:
1. An integrated semiconductor device comprising:
   a. a semiconductor body;
   b. at least a multi-layer semiconductor circuit element located in said body and adjoining a surface thereof;
   c. a tub-shaped isolation zone entirely surrounding the circuit element in the semiconductor body and isolating said circuit element from the remainder of said semiconductor body, said circuit element comprising a first zone of a certain conductivity type adjoining the inner wall of said isolation zone, said isolation zone having a conductivity type opposite to that of said first zone and to that of the part of the semiconductor body surrounding said isolation zone, said isolation zone and said first zone of said circuit element defining a first p,n junction therebetween and said isolation zone forming a second p,n junction with said semiconductor body; and
   d. means for short-circuiting said first p,n junction, said means being connected to said circuit element via only said first zone and to said isolation zone.
2. An integrated semiconductor device as in claim 1, wherein said short-circuit means comprises a metal layer disposed at the said surface of the semiconductor body.

3. An integrated semiconductor device as in claim 1, wherein said circuit element is a transistor of which only the collector zone adjoins the isolation zone.
4. An integrated semiconductor device as in claim 1, wherein said circuit element has a four-layer structure comprising layers of alternate conductivity types, two of the four layers constituting end zones of the circuit element and the remaining two layers constituting intermediate zones of the circuit element, only one of said end zones adjoining said isolation zone.
5. An integrated semiconductor device as in claim 1, wherein said circuit element comprises a four-layer structure comprising layers of alternate conductivity types, two of the four-layers constituting end zones of the circuit element and the remaining two layers constituting intermediate zones of said circuit element, only one of said intermediate zones adjoining said isolation zone.
6. An integrated circuit as in claim 1, comprising at least two tub-shaped zones that each surround respective semiconductor circuit elements, wherein said p,n junctions between said isolation zones and the adjoining zones of the said circuit elements are substantially short-circuited, said isolation zones having a common part which is present between said circuit elements and adjoins the surface of the semiconductor body.
7. An integrated circuit as in claim 1, wherein the part of the semiconductor body surrounding said tub-shaped isolation zone has a resistivity of at least 6 Ohm.cm.
8. An integrated circuit device as in claim 1, wherein said first zone of said circuit element adjoining the inner wall of the said isolation zone comprises an edge zone adjoining the isolation zone and the surface of the semiconductor body, said edge zone being more highly doped than the remaining part of the said first zone of the circuit element and being separated from the other zones of the circuit element.
9. An integrated semiconductor device comprising:
   a. a semiconductor body;
   b. at least a multi-layer semiconductor circuit element located in said body and adjoining a surface thereof;
   c. a tub-shaped isolation zone entirely surrounding the circuit element in the semiconductor body and isolating said circuit element from the remainder of said semiconductor body, said circuit element comprising a first zone of a certain conductivity type adjoining the inner wall of said isolation zone, said isolation zone having a conductivity type opposite to that of said first zone and to that of the part of the semiconductor body surrounding said isolation zone, said isolation zone and said first zone of said circuit element defining a first p,n junction therebetween and said isolation zone forming a second p,n junction with said semiconductor body; and
   d. means for shunting said first p,n junction.

* * * * *